United States Patent
Stierman et al.

(10) Patent No.: US 6,534,327 B2
(45) Date of Patent: Mar. 18, 2003

(54) METHOD FOR REWORKING METAL LAYERS ON INTEGRATED CIRCUIT BOND PADS

(75) Inventors: Roger J. Stierman, Dallas, TX (US); Thomas M. Moore, Dallas, TX (US); Gregory B. Shinn, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/832,968

(22) Filed: Apr. 11, 2001

(65) Prior Publication Data

US 2001/0046721 A1 Nov. 29, 2001

Related U.S. Application Data

(60) Provisional application No. 60/196,705, filed on Apr. 13, 2000.

(51) Int. Cl.⁷ .......................................... H01L 21/4763
(52) U.S. Cl. .......................................................... 438/4
(58) Field of Search ..................... 438/4, 7, 12, 13, 438/14

(56) References Cited

U.S. PATENT DOCUMENTS

| | | |
|---|---|---|
| 4,931,149 A | 6/1990 | Stierman et al. |
| 5,023,697 A | 6/1991 | Tsumura |
| 5,024,746 A | 6/1991 | Stierman et al. |
| 5,201,454 A | 4/1993 | Alfaro et al. |
| 5,225,034 A | 7/1993 | Yu et al. |
| 5,244,140 A | 9/1993 | Ramsey et al. |
| 5,354,490 A | 10/1994 | Yu et al. |
| 5,455,195 A | 10/1995 | Ramsey et al. |
| 5,527,423 A | 6/1996 | Neville et al. |
| 5,567,300 A | 10/1996 | Datta et al. |
| 5,785,236 A | 7/1998 | Cheung et al. |
| 5,840,629 A | 11/1998 | Carpio |
| 5,863,307 A | 1/1999 | Zhou et al. |
| 5,897,375 A | 4/1999 | Watts et al. |
| 5,948,697 A | 9/1999 | Hata |
| 5,954,997 A | 9/1999 | Kaufman et al. |
| 5,958,288 A | 9/1999 | Mueller et al. |
| 6,001,730 A | 12/1999 | Farkas et al. |
| 6,027,997 A | 2/2000 | Yu et al. |
| 6,030,425 A | 2/2000 | Hata |
| 6,340,601 B1 * | 1/2002 | Curran et al. ................. 438/4 |

* cited by examiner

Primary Examiner—Vu A. Le
Assistant Examiner—Beth E. Owens
(74) Attorney, Agent, or Firm—Michael K. Skrehot; Wade James Brady III; Frederick J. Telecky, Jr.

(57) ABSTRACT

A method for reworking integrated circuit (IC) wafers having copper-metallized bond pads exposed in protective overcoat openings and one or more bondable metal layers deposited onto the bond pads by a technology which may produce some parts with off-spec or missing depositions. After identifying the wafer with off-spec metal layers, a layer of glass buffer is deposited over those wafers, which also fill any missing depositions at least partially. The glass-covered surface is then chemically-mechanically polished until the off-spec metal layers and at least a portion of the protective overcoat are removed, without damaging the copper metallization. Finally, a fresh layer of protective overcoat is deposited, selectively opened to expose the bond pads, and provided anew with one or more bondable metal layers.

20 Claims, 1 Drawing Sheet

METHOD FOR REWORKING METAL LAYERS ON INTEGRATED CIRCUIT BOND PADS

CROSS REFERENCE TO RELATED APPLICATIONS

This application claims priority under 35 U.S.C. §119 based upon provisional patent application No. 60/196,705, filed Apr. 13, 2000. In addition, this application is related to provisional patent application No. 60/183,405, filed Feb. 18, 2000.

BACKGROUND OF THE INVENTION

The present invention is related in general to the field of semiconductor devices and processes and more specifically to a method for reworking metal layers misprocessed on bond pads of integrated circuits having copper metallization.

DESCRIPTION OF THE RELATED ART

In integrated circuits (IC) technology, pure or doped aluminum has been the metallization of choice for interconnection and bond pads for more than four decades. Main advantages of aluminum include ease of deposition and patterning. Further, the technology of bonding wires made of gold, copper, or aluminum to the aluminum bond pads has been developed to a high level of automation, miniaturization, and reliability. Examples of the high technical standard of wire bonding to aluminum can be found in U.S. Pat. No. 5,455,195, issued on Oct. 3, 1995 (Ramsey et al., "Method for Obtaining Metallurgical Stability in Integrated Circuit Conductive Bonds"); U.S. Pat. No. 5,244,140, issued on Sep. 14, 1993 (Ramsey et al., "Ultrasonic Bonding Process Beyond 125 kHz"); U.S. Pat. No. 5,201,454, issued on Apr. 13, 1993 (Alfaro et al., "Process for Enhanced Intermetallic Growth in IC Interconnections"); U.S. Pat. No. and 5,023,697, issued on Jun. 11, 1991 (Tsumura, "Semiconductor Device with Copper Wire Ball Bonding").

In the continuing trend to miniaturize the ICs, the RC time constant of the interconnection between active circuit elements increasingly dominates the achievable IC speed-power product. Consequently, the relatively high resistivity of the interconnecting aluminum now appears inferior to the lower resistivity of metals such as copper. Further, the pronounced sensitivity of aluminum to electromigration is becoming a serious obstacle. Consequently, there is now a strong drive in the semiconductor industry to employ copper as the preferred interconnecting metal, based on its higher electrical conductivity and lower electromigration sensitivity. From the standpoint of the mature aluminum interconnection technology, however, this shift to copper is a significant technological challenge.

Copper has to be shielded from diffusing into the silicon base material of the ICs in order to protect the circuits from the carrier lifetime killing characteristic of copper atoms positioned in the silicon lattice. For bond pads made of copper, the formation of thin copper(I)oxide films during the manufacturing process flow has to be prevented, since these films severely inhibit reliable attachment of bonding wires, especially for conventional gold-wire ball bonding. In contrast to aluminum oxide films overlying metallic aluminum, copper oxide films overlying metallic copper cannot easily be broken by a combination of thermocompression and ultrasonic energy applied in the bonding process. As further difficulty, bare copper bond pads are susceptible to corrosion.

In order to overcome these problems, a process has been disclosed to cap the clean copper bond pad with a layer of aluminum and thus re-construct the traditional situation of an aluminum pad to be bonded by conventional gold-wire ball bonding. A suitable bonding process is described in U.S. Pat. No. 5,785,236, issued on Jul. 28, 1998 (Cheung et al., "Advanced Copper Interconnect System that is Compatible with Existing IC Wire Bonding Technology"). The described approach, however, has several shortcomings.

First, the fabrication cost of the aluminum cap is higher than desired, since the process requires additional steps for depositing metal, patterning, etching, and cleaning. Second, the cap must be thick enough to prevent copper from diffusing through the cap metal and possibly poisoning the IC transistors. Third, the aluminum used for the cap is soft and thus gets severely damaged by the markings of the multiprobe contacts in electrical testing. This damage, in turn, becomes so dominant in the ever decreasing size of the bond pads that the subsequent ball bond attachment is no longer reliable.

A low-cost structure and method for capping the copper bond pads of copper-metallized ICs has been disclosed on U.S. patent application Ser. No. 60/183,405, filed on Feb. 18, 2000. The present invention is related to that application. The structure provides a metal layer electrolessly plated onto the copper, which impedes the up-diffusion of copper. Of several possibilities, nickel is a preferred choice. This layer is topped by a bondable metal layer, which also impedes the up-diffusion of the barrier metal. Of several possibilities, gold is a preferred choice. In a variation of this sequence of metal layers, a second barrier layer such as palladium is electrolessly deposited on the nickel, blocking its up-diffusion, and then followed by a bondable metal such as gold. Metallurgical connections stacked cap of layers can then be performed by conventional wire bonding.

It is difficult, though, to plate these bond pad caps uniformly in electroless deposition systems, because electroless deposition is affected by local reactant concentrations and by the agitation velocities of the aqueous solution. Deposition depletes the reactants in areas around the bond pads. Increasing the agitation of the solution only exacerbates the deposition nonuniformity, which is influenced by the flow direction of the solution. Also, a few bond pads may not receive any metal deposition. The problem is further complicated when a whole batch of wafers is to be plated simultaneously in order to reduce cost, since known control methods have been applied only to process single wafers under applied electrical bias. See, for example, U.S. Pat. No. 5,024,746, issued Jun. U.S. Pat. No. 18, 1991, and 4,931,149, issued Jun. 5, 1990 (Stierman et al., "Fixture and a Method for Plating Contact Bumps for Integrated Circuits").

An urgent need has arisen for a reliable method of reworking metal caps over copper bond pads which combines minimum fabrication cost with maximum correction control of the IC structure. The reworking method should be flexible enough to be applied for different IC product families and a wide spectrum of design and process variations. Preferably, these innovations should be accomplished while shortening production cycle time and increasing throughput, and without the need of expensive additional manufacturing equipment.

SUMMARY OF THE INVENTION

The present invention discloses a method for reworking integrated circuit (IC) wafers having copper-metallized bond pads exposed in protective overcoat openings and one or more bondable metal layers deposited onto the bond pads by a technology which may produce some parts with off-spec or missing depositions. After identifying the wafer with off-spec metal layers, a layer of glass buffer is deposited over those wafers, which also fill any missing depositions at least partially. The glass-covered surface is then chemically-mechanically polished until the off-spec metal layers and at least portion of the protective overcoat are removed, without damaging the copper metallization. Finally, a fresh layer of protective overcoat is deposited, selectively opened to expose the bond pads, and provided anew with one or more bondable metal layers.

The slurry for the chemical-mechanical polishing contains oxidizing or hydroxylating agents as well as mechanical polishing components for metals which are not readily oxidized. In order to minimize undesired scratches of the underlying copper or dielectric layers, a combination of buffers and soft poromeric pads is used. Alternatively, organic buffer layers can be used instead of the glass buffer.

The present invention is related to high density and high speed ICs with copper interconnecting metallization, especially those having high numbers of metallized inputs/outputs, or "bond pads". These circuits can be found in many device families such as processors, digital and analog devices, logic devices, high frequency and high power devices, and in both large and small area chip categories.

It is an aspect of the present invention to increase the process yield of wafer fabrication, since it provides a low-cost rework method for wafers misprocessed almost at the end of the process flow. It is towards the completion of the fabrication process when a high amount of work and time has already been invested and the wafers represent high value.

Another aspect of the invention is to support technologies applicable to bond pad area reduction and thus the shrinking of IC chips. Consequently, the invention helps to alleviate the space constraint of continually shrinking applications such as cellular communication, pagers, hard disk drives, laptop computers and medical instrumentation.

Another aspect of the invention is to support the fabrication of bond pad metal caps by the self-defining process of electroless deposition, which is preferable over costly photolithographic and alignment techniques.

Another aspect of the invention is to help advancing the process and reliability of wafer-level multi-probing by eliminating probe marks and subsequent bonding difficulties.

Another aspect of the invention is to provide materials and process concepts which are flexible so that they can be applied to many families of semiconductor products, and are general so that they can be applied to several generations of products.

Another aspect of the invention is to use only materials and processes most commonly employed and accepted in the fabrication of advanced IC devices, thus avoiding the cost of new capital investment and using the installed fabrication equipment base.

These aspects have been achieved by the teachings of the invention concerning selection criteria and process flows suitable for mass production. Various modifications have been successfully employed to satisfy different selections of bonding technologies.

In the first embodiment of the invention, a glass layer is deposited by a spin-on technique, approximately filling in any bond pad opening having missing or very thin metal cap layers. A slurry for chemical mechanical polishing (CMP) is selected which has nearly equal polishing speeds for the metal layers (such as nickel and palladium) and the protective overcoat (such as silicon oxynitride). The bondable gold layer is thin enough that the CMP slurry does not need to be tailored for it.

In the second embodiment of the invention, the electrolessly plated metal layers are non-uniform or not thick enough, but all copper-metallized bond pads are covered. A non-selective CMP slurry polishes the protective overcoat and the metal layers to almost the copper metallization. An auxiliary glass layer may not be necessary.

In all preferred embodiments, optical reflectivity monitors and/or mechanical roughness sensors indicate the appearance of the borderline to the copper metallization and its surrounding dielectric. Any damage the copper or its surrounding dielectric is thus avoided.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
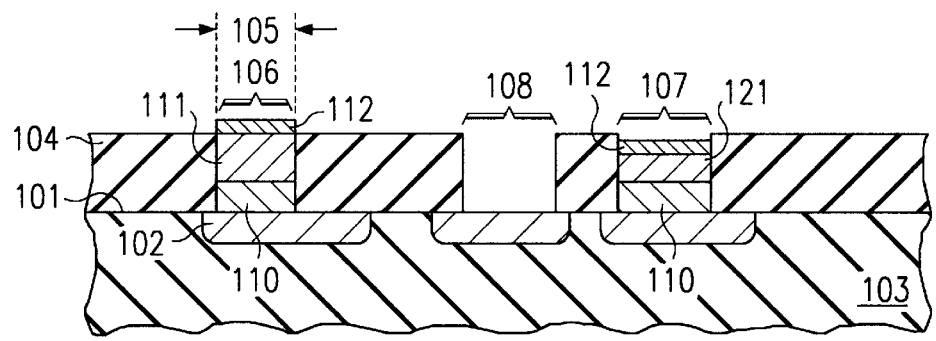
FIG. 1 is a schematic and simplified cross section of a portion of an integrated circuit wafer having off-spec bond pad metal layers, identified for reworking according to the first embodiment process of the invention.

FIG. 1 shows in schematic fashion the cross section of a small portion of an integrated circuit (IC) fabricated on the active surface 101 of a semiconductor wafer. The IC has copper interconnecting metallization, which also provides the metallization for the plurality of bond pads 102. Actually, the copper traces are imbedded in a refractory metal shield (not shown in FIG. 1), which prevents the diffusion of copper into parts of the IC. Typical shield materials include tantalum nitride, tantalum silicon nitride, tungsten nitride, tungsten silicon nitride, titanium, titanium nitride, or titanium tungsten.

Bond pads 102 are surrounded by dielectric IC portions 103, only summarily indicated in FIG. 1. These electrically insulating portions may include not only the traditional plasma-enhanced chemical vapor deposited dielectrics such as silicon dioxide, but also newer dielectric materials having lower dielectric constants, such as silicon-containing hydrogen silsesquioxane, organic polyimides, aerogels, and parylenes, or stacks of dielectric layers including plasma-generated or ozone-produced tetraethylorthosilicate oxide. Since these materials are less dense and mechanically weaker than the previous standard insulators, the dielectric under the copper is often reinforced. Examples can be found in U.S. patent applications Ser. No. 60/085,876, filed on May 18, 1998 (Saran et al., "Fine Pitch System and Method for Reinforcing Bond Pads in Semiconductors"), and Ser. No. 60/092,961, filed Jul. 14, 1998 (Saran, "System and Method for Bonding over Active Integrated Circuits").

The surface 101 of the semiconductor wafer is covered by a moisture-impenetrable protective overcoat 104. This overcoat is usually made of silicon nitride or silicon oxynitride, commonly 0.5 to 1.0 $\mu$m thick. Windows 105 are opened in the overcoat in order to expose portion of the copper metallization 102. The copper exposed by these openings is commonly referred to as the bond pad metallization.

Since copper is susceptible to corrosion and even thin copper(I)oxide films are difficult to bond to, the U.S patent application Ser. No. 60/183,405, filed on Feb. 18, 2000 (to which the present invention is related) provides structures and processes of a cap formed over the exposed copper. According to that application, the cap consists of a metal and has a coordinated thickness such that it satisfies three requirements:

The cap acts as a barrier against the up-diffusion of copper to the surface of the cap where the copper might impede the subsequent wire bonding operation. Specifically, for the cap the metal selection and thickness are coordinated such that the cap reduces the up-diffusion of copper at 250° C. by more than 80% compared with the absence of the barrier metal.

The cap is fabricated by a technique, which avoids expensive photolithographic steps. Specifically, an electroless process is used to deposit the cap metal layer.

The cap metal has a surface which is bondable. Specifically, conventional ball and wedge bonding techniques can be used to connect metal wires and other coupling members metallurgically to the bond pad.

FIG. 1 depicts examples of bond pad caps designed to be a stack of three metal layers, each layer deposited by an electroless plating process. Bond pad 106 shows a satisfactory cap: all three layers are deposited in their predetermined respective thickness ranges.

Layer 110 is positioned over copper area 102, sometimes deposited on a seed metal layer (not shown in FIG. 1). Layer 110 consists of a metal acting as a diffusion barrier against copper. Examples for layer 110 are nickel, cobalt, chromium, molybdenum, titanium, tungsten, and alloys thereof. These metals are inexpensive and can be deposited by electroless plating; however, they are poorly bondable. As mentioned above, in these metals copper has a diffusion coefficient of less than $1\times10E-23$ cm$^2$/s at 250° C. Consequently, these metals are good copper diffusion barriers. The layer thicknesses, required to reduce copper diffusion by more than 80% compared to the absence of the layers, are obtained by diffusion calculations. Generally, a barrier thickness from about 0.5 to 1.5 $\mu$m will safely meet the copper reduction criterion.

Layer 111 is positioned over layer 110 as an effective diffusion barrier against the up-diffusing metal used in layer 110. The intent is to de-emphasize the barrier function of the outermost layer 112, and rather emphasize its bondability function. Consequently, the thickness required for the outermost layer 112 can be reduced, thus saving cost. Examples for layer 111 are palladium, cobalt, platinum, and osmium. Examples for layer 112 are gold, platinum, and silver.

Metals used for layer 111 (such as palladium) have a diffusion coefficient for the metals used in barrier layer 110 (such as nickel) of less than $1\times10E-14$ cm$^2$/s at 250°C. The layer thicknesses required to reduce the up-diffusion of metal used in layer 110 by more than 80% compared to the absence of layer 111 are obtained from diffusion calculations. Generally, a thickness of layer 111 of about 0.4 to 1.5 $\mu$m will safely meet the reduction criterion for metal diffusing from layer 110.

The thickness of the bondable outermost layer 112 (such as gold) is in the range from about 0.02 to 0.1 gum.

The preferred process of depositing layers 110, 111 and 112 is by electroless plating. An example of an electroless plating process flow is described in the U.S. Patent Application quoted above. In general, electroless plating is well controlled and offers high process yield. However, it is known that some misprocessing may occasionally happen. As a result, the plated layers may have characteristics outside of the specification window. For instance, in FIG. 1, bond pad 107 shows the correct thickness for layer 110, however an off-spec thickness for layer 121 (too thin compared to layer 111, though same material), and again the correct thickness for layer 112. As another example in FIG. 1, bond pad 108 shows all three layer missing.

Whenever any layer deposition of the bond pad cap falls outside of specifications, it affects the IC wafer in its process flow close to the finish of a long and expensive series of manufacturing steps, i.e., it affects a wafer of very high value. Consequently, it is economically advantageous to reprocess the wafer in order to eliminate the off-spec layers, repeat the deposition, and obtain bond pad caps within specifications. According to the first embodiment of the invention, the method for reworking of misprocessed metal caps over copper-metallized bond pads comprises the following steps:

Inspecting wafers

After completing the electroless plating process steps for the metal layers capping the bond pad copper metallization, the wafer is inspected for the quality of the deposited layers. Inspection techniques may utilize a high-magnification microscope, X-ray fluorescence equipment, and/or a profilometer based on stylus or reflected light beam. The inspection detects missing, incomplete, non-uniform, defective, or otherwise off-spec layers. Examples are given in FIGS. 1 and 2: The cap metal layers are missing in bond pad 108, at least one layer is incomplete (too thin) in bond pad 107.

Spinning-on Glass

Figure 2:
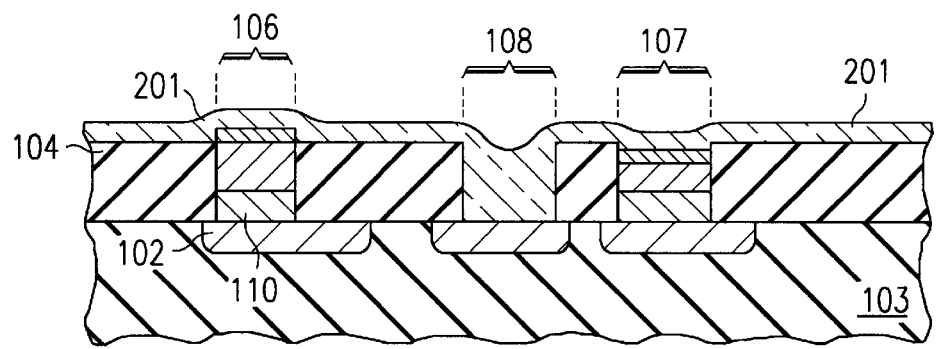
FIG. 2 is a schematic and simplified cross section of a portion of an integrated circuit wafer having off-spec bond pad metal layers, at the beginning of the rework process according to the first embodiment of the invention.

The off-spec wafers receive a coating with spin-on glass in order to create a substantially planar surface. Several types of glasses may be used, including TEOS (tetraethylorthosilicate). The result is schematically shown in FIG. 2. The spin-on glass 201 covers the well-processed metal layers of bond pad 106 and surrounding surfaces of overcoat 104 with a relatively thin buffer. However, the spin-on glass covers bond pads such as 107, having cap metal layer too thin, or especially bond pads such as 108, having no cap metal layers at all, with a relatively thick buffer. The spin-on glass is capable to fill-in low spots and voids and thus creates a substantially planar surface across the whole wafer.

Chemically-Mechanically Polishing

Figure 3:
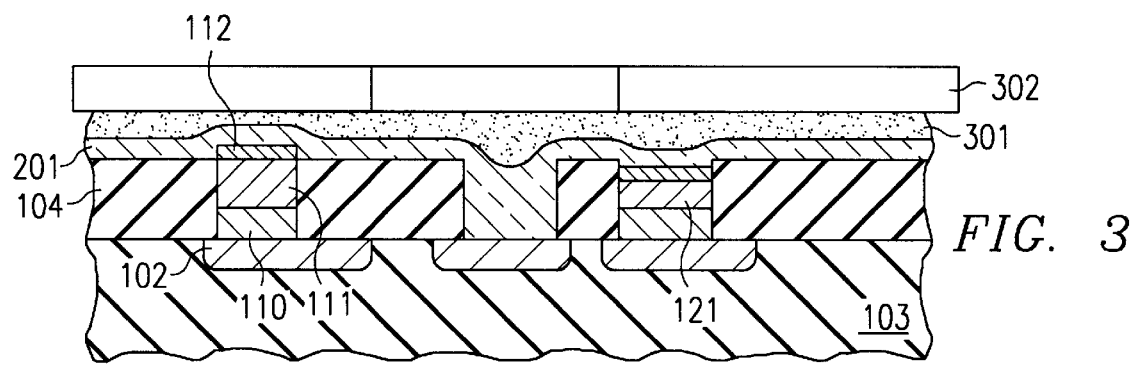
FIG. 3 is a schematic and simplified cross section of a portion of an integrated circuit wafer having off-spec bond pad metal layers, in the rework process according to the first embodiment of the invention.

Subjecting the glass-covered wafer surface to the process of chemical-mechanical polishing (CMP) requires the process steps of:

Mixing an abrasive slurry so that it polishes the metal layers (110, 111, 112, and 121 in FIG. 3) at approximately the same rate as the protective overcoat of the wafer (104 in FIG. 3). In FIG. 3, the slurry 301 is shown to fill-in the space between the spin-on glass 201 and the polishing plate 302.

Applying the slurry 301 for grinding the metal layers as well as the protective overcoat until the appearance of the copper metallization (102 in FIG. 3) and its surrounding dielectric 103 is indicated. This appearance is indicated by an optical reflectivity monitor or a mechanical roughness sensor, which are suitable for identifying the boundary 401 of the bond pad copper 102 and its surrounding dielectric 103. Usually, the boundary 401 is identical with the surface 101 of the wafer discussed in FIG. 1.

Abrasive slurries with either standardized or customized characteristics are commercially available from suppliers such as Cabot Corporation, Boston, Mass., U.S.A., or Rodel, Inc., Newark, Del., U.S.A. These suppliers are capable of mixing the slurries from components, having oxidizing or hydroxylating characteristics and mechanically abrasive characteristics, in water so that the slurries become suitable for polishing oxidizable and non-oxidizable metals, hard and soft metals, as well as inorganic dielectrics (such as silicon nitride or oxynitride) at approximately the same rate. A number of specific slurry compositions and characteristics have been described in patents, together with their target metals and dielectrics to be polished. Examples are the following:

U.S. Pat. No. 5,954,997, issued on Sep. 21, 1999 (Kaufman et al, "Chemical Mechanical Polishing Slurry Useful for Copper Substrates").

U.S. Pat. No. 5,527,423, Issued on Jun. 18, 1996 (Neville et al., "Chemical Mechanical Polishing Slurry for Metal Layers").

U.S. Pat. No. 5,958,288, issued on Sep. 28, 1999 (Mueller et al., "Composition and Slurry Useful for Metal CMP").

U.S. Pat. No. 5,897,375, issued on Apr. 27, 1999 (Watts et al., "Chemical Mechanical Polishing Slurry for Copper and Method of Use in Integrated Circuit Manufacture")

U.S. Pat. No. 6,001,730, issued on Dec. 14, 1999 (Farkas et al., "Chemical Mechanical Polishing Slurry for Polishing Copper Interconnects which use Tantalum-Based Barrier Layers").

U.S. Pat. No. 6,027,997, issued on Feb. 22, 2000 (Yu et al., "Method for Chemical Mechanical Polishing a Semiconductor Device using Slurry").

U.S. Pat. No. 5,225,034, issued on Jul. 6, 1993 (Yu et al., "Method of Chemical Mechanical Polishing Predominantly Copper Containing Metal Layers in Semiconductor Processing").

U.S. Pat. No. 5,354,490, issued on Oct. 11, 1994 (Yu et al., "Slurries for Chemical Mechanical Polishing Copper Containing Metal Layers").

U.S. Pat. No. 5,567,300, issued on Oct. 22, 1996 (Datta et al., "Electrochemical Metal Removal Technique for & Planarization of Surfaces").

U.S. Pat. No. 5,840,629, issued on Nov. 24, 1998 (Carpio, "Copper Chemical Mechanical Polishing Slurry Utilizing a Chromate Oxidant").

U.S. Pat. No. 5,863,307, issued on Jan. 26, 1999 (Zhou et al., "Method and Slurry Composition for Chemical-Mechanical Polish Planarizing for Copper Containing Conductor Layers"). U.S. Pat. No. 5,948,697, issued on Sep. 7, 1999 (Hata, "Catalytic Acceleration and Electric Bias Control of CMP Processing").

U.S. Pat. No. 6,030,425, issued on Feb. 29, 2000 (Hata, "Catalytic Acceleration and Electrical Bias Control of CMP Processing").

Figure 4:
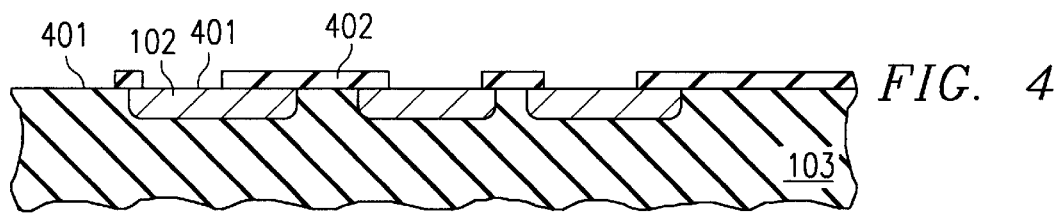
FIG. 4 is a schematic and simplified cross section of a portion of an integrated circuit wafer having off-spec bond pad metal layers, at the end of the rework process according to the first embodiment of the invention.

In combination with the slurry, the polishing pad 302 in FIG. 3 is selected so that scratches of copper 102 or dielectrics 103 are minimized. Preferably, a soft poromeric polishing pad is used. After completing the polishing process, the reworked wafer surface may look like shown schematically in FIG. 4, with only small, thin and irregular remnants 402 of the protective overcoat remaining, or none at all. This reworked wafer surface is now ready for the final process steps of the method:

Depositing a fresh layer of protective overcoat.

Photolithographically defining the openings for the bond pads.

Selectively etching the overcoat and exposing the bond pads.

Repeating the electroless plating steps for depositing the cap metal layers.

The second embodiment of the invention addresses the reworking of the bond pad metal caps, when the inspection step indicates a misprocessed wafer having some cap metal layers in all bond pad openings (i.e., no bond pad without metal layers), but pads with non-uniform, incomplete, defective, or insufficiently thick layers. In this case, the corrective step of depositing a glass buffer by spin-on coating can be omitted. Instead, the CMP slurry, nonselective for the silicon nitride/oxynitride overcoat and the misprocessed cap metal layers, is used directly. As described above, care still needs to be taken to mix the slurry for approximately equal polishing speeds of the overcoat material and the different cap metals, such as nickel and palladium (the gold film is too thin to be of much concern). After polishing and reworking in this somewhat simplified process flow, the reworked wafer looks similar to the case shown in FIG. 4, and the corrective reprocessing can proceed as described above.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention can be applied to IC bond pad metallizations other than copper, which are difficult or impossible to bond by conventional ball or wedge bonding techniques, such as alloys of refractory metals and noble metals. As another example, the invention may use a hard rather than a soft poromeric polishing pad in order to minimize scratches or other damage to the bond pad metallization or dielectric materials surrounding the bond pads. As another example, the invention applies to any sort of glass buffer or organic buffer layer, independent of the method of depositing the buffer. It is therefore intended that the appended claims encompass any such modifications or embodiments.

We claim:

1. A method for reworking integrated circuit wafers having an active surface including copper-metallized bond pads exposed in protective overcoat openings, comprising the steps of:

depositing metal layers onto said bond pads under conditions that are known to yield some parts that fail to meet specifications and some pads with missing deposition;

inspecting said wafers in order to identify those said wafers which have off-spec metal layers;

depositing a layer of glass over said active surface, substantially covering said surface and at least partially filling any missing depositions;

chemically-mechanically polishing said glass-covered surface until said metal layers and said overcoat are removed, without damaging said copper-metallized bond pads;

depositing a fresh layer of said overcoat, photo-lithographically defining said openings, selectively exposing said bond pads; and repeating the deposition of said metal layers.

2. The method according to claim 1 wherein said protective overcoat is made of silicon nitride, silicon oxynitride or combinations thereof.

3. The method according to claim 1 wherein said metal layers comprise bondable metals.

4. The method according to claim 1 wherein said metal layers may be a single layer or a stack of two, three or four layers selected from a group consisting of platinum, rhodium, iridium, osmium, palladium, tin, nickel, cobalt, chromium, molybdenum, titanium, tungsten, gold, silver, and alloys thereof.

5. The method according to claim 1 wherein said layer deposition is electroless plating.

6. The method according to claim 1 wherein said off-spec layers include missing, incomplete, or defective layers, or layers otherwise not meeting specified characteristics.

7. The method according to claim 6 wherein said specified characteristics include layer thickness and uniformity.

8. The method according to claim 1 wherein said glass layer is deposited by a spin-on technique.

9. The method according to claim 1 wherein said step of polishing comprises:

mixing an abrasive slurry so that it polishes said off-spec metal layers at approximately the same rate as said protective overcoat; and applying said slurry for grinding the off-spec metal layers as well as the protective overcoat until the appearance of said copper-metallized bond pads is indicated, thereby avoiding damage to said copper-metallized bond pads.

10. The method according to claim 9 wherein said slurry comprises components having oxidizing or hydroxylating characteristics and mechanically abrasive characteristics so that said slurry is suitable for oxidizable and nonoxidizable metals, hard and soft metals, and for inorganic dielectrics.

11. The method according to claim 9 wherein said appearance is indicated by an optical reflectivity monitor and a mechanical roughness sensor, suitable for identifying the boundary of said copper-metallized bond pads.

12. The method according to claim 9 wherein said slurry is supported by a soft poromeric polishing pad in order to minimize scratches.

13. A method of forming metallization on bond pads in an integrated circuit, said bond pads exposed in first openings of a first protective overcoat disposed over said integrated circuit, comprising the steps of:

depositing a layer of planarizing material over said integrated circuit;

chemically-mechanically polishing said planarizing material-covered integrated circuit to remove said first protective overcoat and expose said bond pads;

depositing a second protective overcoat over said integrated circuit;

forming second openings in said second protective overcoat to expose said bond pads; and depositing a bondable metal layer over each of said bond pads.

14. The method of claim 13, further comprising a step of forming a diffusion barrier metal layer between bond pad and said bondable metal layer on each of said bond pads.

15. The method of claim 14, further comprising a step of forming a second diffusion barrier metal layer between said diffusion barrier metal layer and said bondable metal layer.

16. A method of forming metallization on bond pads in an integrated circuit, said bond pads exposed in first openings of a first protective overcoat disposed over said integrated circuit, comprising the steps of:

depositing a layer of planarizing material over said integrated circuit;

chemically-mechanically polishing said planarizing material-covered integrated circuit to remove said first protective overcoat and expose said bond pads;

depositing a second protective overcoat over said integrated circuit;

forming second openings in said second protective overcoat to expose said bond pads;

depositing a diffusion barrier metal layer on each of said bond pads; and depositing a bondable metal layer over said diffusion barrier layer.

17. The method of claim 16, further comprising a step of depositing a second diffusion barrier metal layer between said diffusion barrier metal layer and said bondable metal layer.

18. The method of claim 16, wherein said diffusion barrier metal layer is nickel and said bondable metal layer is gold.

19. The method of claim 17, wherein said diffusion barrier metal layer is nickel, said second diffusion barrier metal layer is palladium, and said bondable metal layer is gold.

20. The method of claim 16, wherein said step of depositing a diffusion barrier metal layer comprises electrolessly depositing a diffusion barrier metal layer.

* * * * *